(12) United States Patent
Buchhauser et al.

(10) Patent No.: US 8,288,861 B2
(45) Date of Patent: Oct. 16, 2012

(54) ENCAPSULATION FOR AN ORGANIC ELECTRONIC COMPONENT, ITS PRODUCTION PROCESS AND ITS USE

(75) Inventors: Dirk Buchhauser, Penang (MY); Debora Henseler, Erlangen (DE); Karsten Heuser, Erlangen (DE); Arvid Hunze, Erlangen (DE); Ralph Paetzold, Roth (DE); Wiebke Sarfert, Herzogenaurach (DE); Carsten Tschamber, Hamburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 447 days.

(21) Appl. No.: 10/599,939

(22) PCT Filed: Apr. 13, 2005

(86) PCT No.: PCT/EP2005/051623
§ 371 (c)(1),
(2), (4) Date: Sep. 18, 2007

(87) PCT Pub. No.: WO2005/104259
PCT Pub. Date: Nov. 3, 2005

(65) Prior Publication Data
US 2008/0057260 A1    Mar. 6, 2008

(30) Foreign Application Priority Data
Apr. 22, 2004 (DE) .......................... 10 2004 019 643

(51) Int. Cl.
*H01L 23/12* (2006.01)

(52) U.S. Cl. ............................ 257/704; 428/76; 313/512
(58) Field of Classification Search .................... 428/68, 428/76; 257/788, 790, 704; 313/512
See application file for complete search history.

(56) References Cited

U.S. PATENT DOCUMENTS

| 6,710,542 | B2 * | 3/2004 | Chun et al. ..................... 313/506 |
| 7,642,642 | B2 * | 1/2010 | Fazzio .......................... 257/704 |
| 2002/0068143 | A1 | 6/2002 | Silvernail et al. |
| 2003/0014323 | A1 | 1/2003 | Scheer |
| 2003/0143423 | A1 * | 7/2003 | McCormick et al. ......... 428/690 |
| 2005/0155704 | A1 * | 7/2005 | Yokajty et al. ................. 156/295 |
| 2011/0177637 | A1 * | 7/2011 | McCormick et al. ........... 438/28 |

FOREIGN PATENT DOCUMENTS

| DE | 102 38 799 | 3/2004 |
| GB | 2 383 683 | 7/2003 |
| JP | 7-169567 | 7/1995 |
| JP | 2002-151253 | 5/2002 |
| JP | 2003-86360 | 3/2003 |
| JP | 2003-243155 | 8/2003 |
| WO | WO 01/89006 | 11/2001 |
| WO | WO 2004/021464 | 3/2004 |

OTHER PUBLICATIONS

"Translation of the Notification of Reasons for Refusal", JP Patent Application No. 2007-508899, mailed on Oct. 15, 2010 (10 pages).

* cited by examiner

Primary Examiner — Alexander Thomas
(74) Attorney, Agent, or Firm — Fish & Richardson P.C.

(57) ABSTRACT

An encapsulation for an organic electronic component, characterized in that the component, encapsulated in a dimensionally stable capsule, is at least partially covered with a protective film.

6 Claims, 1 Drawing Sheet

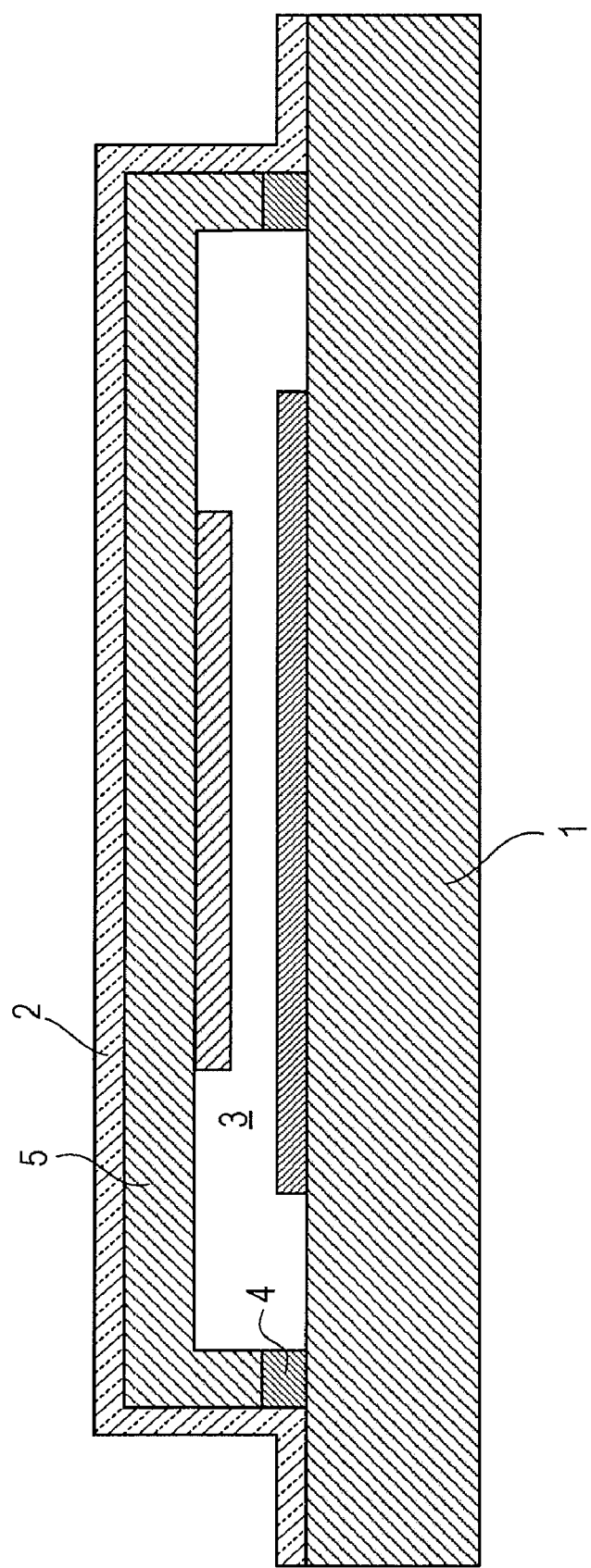

ured in ENCAPSULATION FOR AN ORGANIC
ELECTRONIC COMPONENT, ITS
PRODUCTION PROCESS AND ITS USE

CROSS-REFERENCE TO RELATED APPLICATIONS

This application is the National Stage of International Application No. PCT/EP2005/051623, filed on Apr. 13, 2005, which claims the priority to German Patent Application Serial No. 10 2004 019 643.5, filed on Apr. 22, 2004. The contents of both applications are hereby incorporated by reference in their entirety.

FIELD OF INVENTION

The invention relates to an encapsulation for an organic electronic component based on a technique that is improved with respect to imperviousness, and a production method and uses therefor.

BACKGROUND OF THE INVENTION

Organic electronic components such as, for example, polymer chips, organic photovoltaic elements and/or organic light-emitting diodes are known. All of these organic electronic components include at least one organic active layer; the material of such a layer or the additional materials present in the layer structure are usually sensitive to oxidation and/or moisture, and the electronic component as a whole therefore usually has to be protected against environmental influences.

One of the most decisive factors in the commercial exploitation of any organic electronic device is the life of the component, which is determined by the stability of the organic active layer(s). The problem here is that no technique has yet been developed by which an organic light-emitting diode (LED) could be protected for example against environmental influences to such an extent that its functionality remains stable for three years or more.

At present, it is standard practice to protect organic electronic components against air and moisture by means of an encapsulation created by inverting a glass or metal cap over the component and attaching it to the substrate. The encapsulation also simultaneously protects the component against mechanical damage, and drying agents/antioxidants, etc., can additionally be fixed to the inside of the capsule.

A disadvantage of the encapsulation-based method, however, is that the material boundary between the substrate, the connecting glue and the capsule is subject to the diffusion of atmospheric moisture and oxygen, which then severely affect the imperviousness of the structure, in particular sharply reducing the life of the component.

For this reason, an encapsulation provided with a dual adhesive bond ("rim coating") has recently been proposed, as in US 2003/0143423, in which the capsule is attached to the substrate as well as possible by means of a first, preferably inner adhesive bond, while a second, preferably outer adhesive bond prevents the ingress of moisture and oxygen insofar as possible. Here again, a disadvantage of these encapsulations is that a diffusion pathway forms along the material boundaries of the various materials (substrate, glue, encapsulation), so that ultimately the imperviousness of the encapsulation is not ideal and the component instead is still damaged by environmental influences. In particular, the barrier effect of the structure as a whole may be determined by the diffusion along the material boundaries, and may therefore be higher than the diffusion through the volume of the adhesive.

SUMMARY OF THE INVENTION

The object of the present invention is, therefore, to make available an encapsulation for an organic electronic component that offers mechanical protection and optimal imperviousness against harmful environmental influences such as atmospheric moisture and/or oxygen.

The invention is therefore directed to an encapsulation for an organic electronic component, characterized in that the encapsulated component is at least partially covered with a protective film. The invention is further directed to a method for producing an encapsulation covered with a protective film, and finally to the use of an encapsulation according to one of the preceding claims to protect organic electronic components, such as organic LEDs, polymer chips and/or organic photovoltaic and/or electrochromic elements and/or display applications that are organically based.

The effect achieved by means of the encapsulation is that the component is protected against mechanical damage, while increased imperviousness to moisture and oxygen is obtained by the at least partial covering with a protective film.

The term "encapsulation" denotes a dimensionally stable covering over the organic electronic component, which dimensionally stable covering is inverted over the component as a finished capsule, for example of metal and/or glass, usually rests on or terminates flush with the substrate, and is then glued thereto. A version of the capsule that is made of crosslinking plastic may also be contemplated, the plastic being applied in a plastically deformable modification and being rendered dimensionally stable by subsequent curing. In cases where the capsule is made of a plastic, various properties, such as thermal conductivity (to dissipate evolved heat), absorbency, etc. can be incorporated into the capsule by the addition of suitable fillers.

In any event, the encapsulation is mechanically stable within given limits and is made of a material that is impermeable to environmental influences such as moisture and/or oxygen.

The encapsulation is preferably glued to the substrate at least once, resulting in an essentially ready-encapsulated organic electronic component, which is then additionally protected and sealed according to the invention by applying a protective film for example at weak points of the encapsulation, such as the transition from the encapsulation to the substrate.

The additional sealing by covering with a protective film can be done either solely at the weak points of the encapsulation or, preferably, over the entire exterior of the component, so that the encapsulated component is additionally completely covered with a thin-barrier film protective film.

The protective film preferably comprises a thin-barrier film of the kind known from sealing technology. These films are distinguished above all by extremely low permeation rates, thereby dramatically reducing the ingress of environmental influences such as moisture and/or oxygen. The protective film can be made of organic or inorganic material, and its material therefore is not firmly established. Where appropriate, a specific property profile (thermal conductivity, color, absorptive properties, etc.) can also be imparted to the protective covering through the addition of a suitable filler, as in the case of the encapsulation.

The thin-barrier films group includes both inorganic materials and organic materials. These are characterized by low permeation rates for their class, even when implemented as thin layers (layer thicknesses of less than 1 mm).

These films can include more than one layer, but need not necessarily do so.

The inorganic layers class includes, non-exclusively, the materials to be made from metal oxides, metal nitrides, metal oxynitrides, silicon compounds and any other type of ceramic compound.

The organic materials class includes in this sense, but non-exclusively, organic compounds, preferably polymer compounds, such as, inter alia, parylenes, hydrofluorocarbons, acrylates, polyester compounds and the like.

If the protective film includes plural layers or plies, organic and inorganic layers can be arranged in any desired order. The organic and/or inorganic plies can be deposited on or laminated onto one another by known techniques or, in other methods, disposed as stand-alone films on the areas to be covered. The material used for the protective film is preferably one that offers better insulating action against moisture and/or oxygen than the glues (even if filled with absorbent) conventionally used with the encapsulation.

The thickness of a protective film can vary from approximately 1 nm to 500 μm. In the case of inorganic films, the thickness of the protective film is preferably within a range of 1 nm to 10 μm, particularly 5 nm to 1 μm, and in the case of organic films in the range of 500 nm to 100 μm, particularly 1 μm to 50 μm.

The protective film can be applied or deposited by various techniques, among which the following methods may be cited: chemical vapor deposition, physical vapor deposition, wet chemical deposition, such as spin coating, dip coating, drop coating, printing techniques such as stencil printing, squeegee printing, screen printing, ink jet processes, spraying, plasma coating methods, plasma polymerization methods, laminating processes, hot sealing, transfer techniques (such as thermotransfer), welding methods and injection molding.

According to one embodiment of the method, the component is in a high-vacuum chamber during deposition.

According to another embodiment, the component is under reduced pressure but not in a high vacuum during deposition.

According to a preferred embodiment, the material of the thin-barrier film protective film is selected so that it can be applied by chemical vapor deposition (CVD). Due to the low degree of molecular alignment in CVD, this method makes it possible to produce a three-dimensional protective film covering of almost any desired shape, i.e. including one that is completely adapted to the encapsulated component to be covered.

A further preferred configuration of the method is designed to minimize thermal stress on the component. To this end, a material for at least one inorganic layer of the protective film is selected so that CVD coating, for example plasma-assisted, can be performed at such low temperatures, for example less than 300° C., particularly less than 100° C., that the functionality of the component is not impaired and the effects of thermal expansion are minimized. One suitable material for this purpose is silicon nitride.

In a further advantageous configuration of the method, the organic material for layer formation in a thin-barrier film protective film is selected so that CVD coating or plasma polymerization can be performed. This is particularly advantageous because the film is completed quickly and provides conformal coating of the object. A suitable material for this purpose is parylene. The parylene group includes, inter alia, the modifications parylene N, C, D and F. All of these differ in terms of the substituents on a six-member carbon ring that is bound on both sides to a $CH_2$ group. No substituents are present in the N; C has one chlorine, D two chlorines and F one fluorine. Coating with parylene C seems to be particularly preferable since it is known to result in the best moisture barrier.

In a further preferred configuration of the invention, the thin-barrier film protective film with which the encapsulated component is covered includes at least one layer made of organic and/or one made of inorganic material. These organic and inorganic layers are for example applied in alternation.

According to one embodiment, the contacting of the component by means of, inter alia, a connecting cable bringing the organic electronic component into contact with external drive or playback electronics or another type of connection (grounding) takes place prior to the application of the thin-barrier film protective film.

BRIEF DESCRIPTION OF THE DRAWINGS

The invention is described further below with reference to an exemplary embodiment:

The FIGURE shows a cross section through an encapsulated organic electronic component covered according to the present invention with protective film.

DETAILED DESCRIPTION OF THE PREFERRED EMBODIMENTS

In the FIGURE there may be recognized the substrate 1, on which the component is disposed. Visible thereon are the component 3, comprising various active layers, and the encapsulation 5, which is attached to the substrate 1 by means of glue 4. Disposed over the encapsulation 5 is the protective film 2, which covers parts of the substrate 1 as well.

The invention discloses for the first time a high-density encapsulation that far outperforms the known encapsulation technologies, since a weak point of the encapsulation, such as for example the transition from the capsule to the substrate or the electronic component as a whole, is covered with a protective film.

The invention claimed is:

1. An encapsulation for an organic electronic component arranged on a substrate,
   wherein the component is encapsulated in a dimensionally stable capsule attached to the substrate by glue comprising absorbents, and
   a protective film covers an entire exterior of the encapsulated component, wherein the entire exterior of the encapsulated component comprises at least an entire outer surface of the dimensionally stable capsule and a top outer entire surface of the substrate,
   the protective film being more insulating against moisture and/or oxygen than an adhesive, at least partially loaded with an adsorbent for moisture and/or oxygen, for gluing an organic electronic component to a substrate wherein said protective film includes at least one thin-barrier film and has a thickness in the range of 1 nm to 500 μm,
   wherein said protective film includes a filler and a film made of silicon nitride.

2. An encapsulation for an organic electronic component arranged on a substrate, the encapsulation comprising:
   the component encapsulated in a dimensionally stable capsule attached to the substrate by glue; and
   a protective film covers an entire exterior of the encapsulated component, wherein the entire exterior of the encapsulated component comprises at least an entire outer surface of the dimensionally stable capsule and a top outer entire surface of the substrate, the capsule comprising horizontal and lateral areas with respect to the component, wherein the lateral areas protrude from the layer formed by the horizontal areas and the glue is arranged between the lateral areas of the capsule and the substrate wherein said protective film includes a thin-barrier film and has a thickness in the range of 1 nm to 500 μm wherein the protective film includes a filler.

3. The encapsulation as in claim 2, wherein said protective film includes a film made of silicon nitride.

4. The encapsulation as in claim 2, wherein the thin-barrier-film further includes organic layers comprising organic materials chosen from parylenes, hydrofluorocarbons, acrylates or polyester compounds and/or the thin-barrier-film includes inorganic layers comprising inorganic materials chosen from metal oxides, metal nitrides, metal oxynitrides.

5. The encapsulation as in claim 4, wherein the organic and inorganic layers are deposited in alteration.

6. The encapsulation as in claim 2, wherein the filler is suitable to impart a specific property profile to the protective film.

* * * * *